(12) United States Patent
Jacobi et al.

(10) Patent No.: US 10,707,132 B2
(45) Date of Patent: *Jul. 7, 2020

(54) METHOD TO RECESS COBALT FOR GATE METAL APPLICATION

(71) Applicants: International Business Machines Corporation, Armonk, NY (US); GLOBALFOUNDRIES INC., Grand Cayman (KY); Lam Research Corporation, Fremont, CA (US)

(72) Inventors: Georges Jacobi, Malta, NY (US); Vimal K. Kamineni, Mechanicville, NY (US); Randolph F. Knarr, Voorheesville, NY (US); Balasubramanian Pranatharthiharan, Watervliet, NY (US); Muthumanickam Sankarapandian, Niskayuna, NY (US)

(73) Assignees: International Business Machines Corporation, Armonk, NY (US); GlobalFoundries Inc., Grand Cayman (KY); LAM Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/557,195

(22) Filed: Aug. 30, 2019

(65) Prior Publication Data

US 2019/0385913 A1 Dec. 19, 2019

Related U.S. Application Data

(63) Continuation of application No. 15/454,445, filed on Mar. 9, 2017, now Pat. No. 10,546,785.

(51) Int. Cl.
*H01L 21/8234* (2006.01)
*H01L 21/8238* (2006.01)
(Continued)

(52) U.S. Cl.
CPC ........... *H01L 21/823456* (2013.01); *H01L 21/28088* (2013.01); *H01L 21/28247* (2013.01);
(Continued)

(58) Field of Classification Search
CPC ....... H01L 21/823456; H01L 21/28088; H01L 29/66545
See application file for complete search history.

(56) References Cited

U.S. PATENT DOCUMENTS

| | | |
|---|---|---|
| 5,940,698 A | 8/1999 | Gardner et al. |
| 6,531,749 B1 | 3/2003 | Matsuki et al. |

(Continued)

OTHER PUBLICATIONS

List of IBM Patents or Patent Applications Treated as Related dated Aug. 30, 2019, 2 pages.

(Continued)

*Primary Examiner* — Marcos D. Pizarro
*Assistant Examiner* — Antonio B Crite
(74) *Attorney, Agent, or Firm* — Scully, Scott, Murphy & Presser, P.C.; Alvin Borromeo

(57) ABSTRACT

After forming a material stack including a gate dielectric, a work function metal and a cobalt gate electrode in a gate cavity formed by removing a sacrificial gate structure, the cobalt gate electrode is recessed by oxidizing the cobalt gate electrode to provide a cobalt oxide layer on a surface of the cobalt gate electrodes and removing the cobalt oxide layer from the surface of the cobalt gate electrodes by a chemical wet etch. The oxidation and oxide removal steps can be repeated until the cobalt gate electrode is recessed to any desired thickness. The work function metal can be recessed after the recessing of the cobalt gate electrode is completed or during the recessing of the cobalt gate electrode.

16 Claims, 9 Drawing Sheets

(51) Int. Cl.
  *H01L 21/28* (2006.01)
  *H01L 29/49* (2006.01)
  *H01L 29/66* (2006.01)
  *H01L 29/40* (2006.01)
(52) U.S. Cl.
  CPC .... *H01L 21/823871* (2013.01); *H01L 29/401* (2013.01); *H01L 29/4958* (2013.01); *H01L 29/4966* (2013.01); *H01L 29/66545* (2013.01)

(56) References Cited

U.S. PATENT DOCUMENTS

| | | | |
|---|---|---|---|
| 6,638,843 B1 | 10/2003 | Hineman | |
| 6,642,094 B2 | 11/2003 | Rotondaro et al. | |
| 6,783,694 B1 | 8/2004 | Lee et al. | |
| 7,153,734 B2 | 12/2006 | Brask et al. | |
| 7,208,361 B2 | 4/2007 | Shah et al. | |
| 7,439,113 B2 | 10/2008 | Doczy et al. | |
| 8,525,232 B2 | 9/2013 | Nogami et al. | |
| 9,012,319 B1* | 4/2015 | Choi | H01L 21/28158 438/591 |
| 9,583,584 B2* | 2/2017 | Park | H01L 29/4966 |
| 2011/0147858 A1* | 6/2011 | Lim | H01L 29/4966 257/412 |
| 2015/0236106 A1 | 8/2015 | Zaleski et al. | |
| 2015/0255458 A1* | 9/2015 | Ando | H01L 29/517 257/401 |
| 2015/0345028 A1 | 12/2015 | Wang et al. | |
| 2016/0043186 A1* | 2/2016 | Liu | H01L 29/6656 257/401 |
| 2017/0025514 A1* | 1/2017 | Wu | H01L 21/28079 |
| 2017/0207312 A1 | 7/2017 | Jan et al. | |
| 2018/0261507 A1* | 9/2018 | Jacobi | H01L 21/82345 |

OTHER PUBLICATIONS

Notice of Allowance dated Nov. 29, 2019 received in U.S. Appl. No. 16/557,128,

* cited by examiner

METHOD TO RECESS COBALT FOR GATE METAL APPLICATION

BACKGROUND

The present application relates to semiconductor device fabrication, and more particularly, to a method of recessing a cobalt gate or contact or interconnect metal for enabling implementation of self-aligned gate or contacts.

Transistors, such as field effect transistors (FETs) are the basic elements of microelectronics and integrated circuits. There has been a continuous drive to scale down or shrink transistors and other semiconductor devices to increase density and improve processing performance. One technique that is used to fabricate transistors is known as a replacement metal gate (RMG) process. A replacement metal gate process involves creating a sacrificial gate during fabrication, and then later replacing the sacrificial gate with a metal gate electrode.

Continuing scaling in manufacturing of complementary-metal-oxide-semiconductor (CMOS) transistors has recently lead to the development of self-aligned contacts, which are used to contact the source and drain (S/D) of the FETs. In order to form self-aligned contacts with current RMG integration schemes, the metal gate electrode needs to be recessed such that a dielectric gate cap can be formed on top of the recessed metal gate electrode to isolate the gate from the S/D contacts. The dielectric gate cap prevents potential shorting between the gate and the S/D contact.

Cobalt (Co) is a promising conductive material used as a metal gate electrode and contact metal due to its low resistance. However, Co cannot be recessed using a dry etch process that is commonly employed in recessing conventional gate metals such as tungsten (W) and aluminum (Al). Therefore, there remains a need for providing a method that allows recessing of a Co gate metal and contact metal for enabling implementation of self-aligned gates or contacts.

SUMMARY

The present application provides a method that allows recessing a Co gate or contact metal for enabling the formation of self-aligned contacts in a RMG process. The Co gate or contact metal can be recessed by oxidation and oxide removal.

In one aspect of the present application, a method of forming a semiconductor structure is provided. In one embodiment, the method includes first providing a structure including a gate cavity exposing a portion of a semiconductor material portion. A gate spacer surrounds the gate cavity. A material stack including, from bottom to top, a gate dielectric, a work function metal and a cobalt gate electrode is then formed within the gate cavity. Next, the cobalt gate electrode is recessed. The recessing the cobalt gate electrode is performed by repeating steps of oxidizing the cobalt gate electrode to form a cobalt oxide layer on a surface of the cobalt gate electrode and removing the cobalt oxide layer. After recessing the work function metal and recessing the gate dielectric, a gate cap is formed above the recessed cobalt gate electrode to completely fill the gate cavity.

In another embodiment, the method includes first providing a structure including a first gate cavity of a first width and exposing a first portion of a semiconductor material portion and a second gate cavity of a second width that is greater than the first width and exposing a second portion of the semiconductor material portion. A first gate spacer surrounds the first gate cavity, and a second gate spacer surrounds the second gate cavity. Next, a first material stack including, from bottom to top, a first gate dielectric, a first work function metal and a first cobalt gate electrode is formed within the first gate cavity, and a second material stack including, from bottom to top, a second gate dielectric, a second work function metal and a second cobalt gate electrode is formed within the second gate cavity. The first cobalt gate electrode and the second cobalt gate electrode are recessed. The recessing the first cobalt gate electrode and the second cobalt gate electrode is performed by repeating steps of oxidizing the first cobalt gate electrode and the second cobalt gate electrode to form a cobalt oxide layer on a surface of each of the first cobalt gate electrode and the second cobalt gate electrode and removing each cobalt oxide layer. After recessing the first work function metal and the second work function metal and recessing the first gate dielectric and the second gate dielectric, a first gate cap is formed above the recessed first cobalt gate electrode to completely fill the first gate cavity and a second gate cap is formed above the recessed second cobalt gate electrode to completely fill the second gate cavity.

In another aspect of the present application, another method of forming a semiconductor structure is provided. The method includes first forming a gate structure over a semiconductor material portion. The gate structure includes, from bottom to top, a gate dielectric, a gate electrode and a gate cap. A gate spacer is then on sidewalls of the gate structure. Next, source/drain regions are formed on opposite sides of the gate structure. Next, after forming an interlevel dielectric (ILD) layer over the source/drain regions and laterally surrounding the gate structure, the ILD layer is patterned to form a contact opening. The contact opening extends through the ILD layer exposing the source/drain regions and the gate structure. The patterning the ILD layer also recesses the gate cap and gate spacer exposed by the contact opening. A contact liner is then formed on surfaces of the source/drain regions, the gate structure and the gate spacer that are exposed within the contact opening, followed by forming a cobalt contact conductor within the contact opening to completely fill the contact opening. Next, the cobalt contact conductor is recessed to provide a cobalt contact conductor portion overlying one of the source/drain regions. The recessing the cobalt contact conductor is performed by repeating steps of oxidizing the cobalt contact conductor to form a cobalt oxide layer on a surface of the cobalt contact conductor and removing the cobalt oxide layer. Next, the contact liner is recessed to provide a contact liner portion contacting one of the source/drain regions.

DETAILED DESCRIPTION

Figure 1:
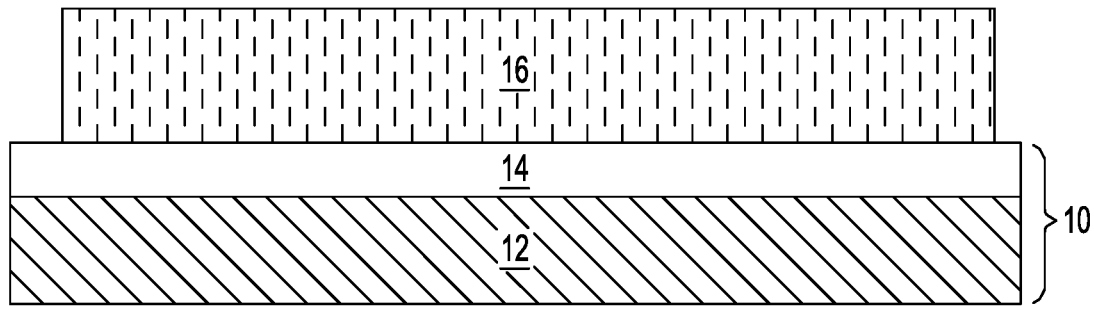
FIG. 1 is a cross-sectional view of a first exemplary semiconductor structure including a semiconductor material portion located on a substrate according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, a first exemplary semiconductor structure according to a first embodiment of the present application includes a semiconductor material portion 16 located on a substrate 10. In some embodiments, and as illustrated in the drawings of the present application, the semiconductor material portion 16 may be a semiconductor fin. In such an embodiment, a plurality of semiconductor fins, i.e., semiconductor material portions, can be formed on the substrate 10. In such an embodiment, the semiconductor material portions are orientated parallel to each other. In other embodiments (not shown), the semiconductor material portion 16 can represent a topmost surface of a planar semiconductor substrate.

In one embodiment of the present application, and as shown, the substrate 10 comprises, from bottom to top, a handle substrate 12 and an insulator layer 14. In another embodiment (not shown), the substrate 10 comprises a remaining portion of a bulk semiconductor substrate. The term "bulk" as used in conjunction with the phrase "semiconductor substrate" denotes that the entire substrate is comprised of at least one semiconductor material.

The exemplary semiconductor structure shown in FIG. 1 can be formed by first providing a bulk semiconductor substrate or a semiconductor-on-insulator (SOI) substrate. When a bulk semiconductor substrate is employed in the present application the at least one semiconductor material that provides the bulk semiconductor substrate can include, but is not limited to, Si, Ge, SiGe, SiC, SiGeC, III/V compound semiconductors such as, for example, InAs, InP, InAsP, and GaAs, and II/VI compound semiconductor materials. In such an embodiment, a topmost semiconductor material layer or portion of the bulk semiconductor substrate can be used as the semiconductor material portion 16, while the remaining portion of the bulk semiconductor substrate can be used as substrate 10. In some embodiments of the present application, the bulk semiconductor substrate may be a single crystalline semiconductor material. In other embodiments of the present application, the bulk semiconductor substrate may be a polycrystalline semiconductor material or an amorphous semiconductor material. The crystal orientation of the bulk semiconductor substrate may be {100}, {110}, or {111}. Other crystallographic orientations besides those specifically mentioned can also be used in the present application.

When an SOI substrate is employed, the SOI substrate includes from, bottom to top, the handle substrate 12, the insulator layer 14, and a topmost semiconductor layer. The topmost semiconductor layer of the SOI substrate will provide the semiconductor material portion 16 of the structure shown in FIG. 1. In some embodiments of the present application, the handle substrate 12 and the topmost semiconductor layer of the SOI substrate may comprise a same semiconductor material. In other embodiments of the present application, the handle substrate 12 and the topmost semiconductor layer of the SOI substrate may comprise a different semiconductor material. The semiconductor material(s) that can be used as the handle substrate 12 and the topmost semiconductor layer include one of the semiconductor materials mentioned above for the bulk semiconductor substrate. In one embodiment, the handle substrate 12 and the topmost semiconductor layer of the SOI substrate are both comprised silicon. In some embodiments, the handle substrate 12 is a non-semiconductor material including, for example, a dielectric material and/or a conductive material.

The handle substrate 12 and the topmost semiconductor layer of the SOI substrate may have the same or different crystal orientation including any of those mentioned above for the bulk semiconductor substrate. The handle substrate 12 and/or the topmost semiconductor layer of the SOI substrate may be a single crystalline semiconductor material, a polycrystalline material, or an amorphous material. Typically, at least the topmost semiconductor layer of the SOI substrate is a single crystalline semiconductor material.

The insulator layer 14 of the SOI substrate may be a crystalline or non-crystalline oxide or nitride. In one embodiment, the insulator layer 14 is an oxide such as, for example, silicon dioxide. In another embodiment, the insulator layer 14 may include a stack of silicon dioxide and boron nitride.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of topmost semiconductor layer of the SOI substrate can be from 10 nm to 100 nm, although lesser or greater thicknesses can also be employed. The thickness of the insulator layer 14 of the SOI substrate typically can be from 1 nm to 200 nm, although lesser or greater thicknesses can also be employed. The thickness of the handle substrate 12 of the SOI substrate is inconsequential to the present application.

In some embodiments of the present application, a hard mask layer (not shown) can be formed on a topmost surface of either the bulk semiconductor substrate or the SOI substrate. The hard mask layer that can be employed is a contiguous layer that covers the entirety of the topmost surface of the bulk semiconductor substrate or the SOI substrate. The hard mask layer that can be employed in the present application may include a semiconductor oxide, a semiconductor nitride and/or a semiconductor oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments of the present application, the hard mask material that can be used in providing the hard mask layer can be formed by a deposition process such as, for example, chemical vapor deposition (CVD) or plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 2 nm to 10 nm, although lesser than or greater thicknesses can also be employed.

Next, the bulk semiconductor substrate or the SOI substrate, with or without the hard mask layer, can be patterned to provide the semiconductor material portion 16 shown in FIG. 1. In embodiments in which semiconductor material portion 16 is not a semiconductor fin, this patterning step can be used to form isolation trenches within the bulk semiconductor substrate or SOI substrate. The isolation trenches are thereafter processed into trench isolation structures.

In one embodiment, the patterning process used to define the semiconductor material portion 16 may include a sidewall image transfer (SIT) process. The SIT process includes forming a contiguous mandrel material layer (not shown) on the topmost surface of the hard mask layer, the bulk semiconductor substrate or the SOI substrate. The contiguous mandrel material layer can include any material (semiconductor, dielectric or conductive) that can be selectively removed from the structure during a subsequently performed etching process. In one embodiment, the contiguous mandrel material layer may be composed of amorphous silicon or polysilicon. In another embodiment, the contiguous mandrel material layer may be composed of a metal such as, for example, Al, W, or Cu. The contiguous mandrel material layer can be formed, for example, by CVD or PECVD. The thickness of the contiguous mandrel material layer (not shown) can be from 50 nm to 300 nm, although lesser and greater thicknesses can also be employed. Following deposition of the contiguous mandrel material layer, the contiguous mandrel material layer can be patterned by lithography and etching to form a plurality of mandrel structures (also not shown).

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, CVD, PECVD, or atomic layer deposition (ALD). Examples of etching that be used in providing the dielectric spacers include any etching process such as, for example, reactive ion etch (RIE). Since the dielectric spacers are used in the SIT process as an etch mask, the width of the each dielectric spacer can be used to determine the width of each semiconductor material portion 16.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the semiconductor material that provides the semiconductor material portion 16. The pattern transfer may be achieved by an etching process. Examples of etching processes that can used to transfer the pattern may include a dry etch process (i.e., RIE, plasma etching, ion beam etching or laser ablation) and/or a chemical wet etch process. In one example, the etching process used to transfer the pattern may include one or more RIE steps. Upon completion of the pattern transfer, the SIT process concludes by removing the dielectric spacers from the structure. Each dielectric spacer may be removed by etching or a planarization process. In some embodiments, lithography and etching can be used to define the semiconductor material portion 16. In some embodiments and following formation of the semiconductor material portion 16, the hard mask material can be removed from atop the semiconductor material portion 16 by a planarization process or by etching.

Other patterning processes such as, for example, lithography and etching or a directed self-assembly (DSA) could be employed in the present application to provide semiconductor material portion 16.

As mentioned above, semiconductor material portion 16 can be a semiconductor fin. As used herein, a "semiconductor fin" refers to a contiguous semiconductor structure that extends upward from a surface of a substrate. In one embodiment, the substrate is insulator layer 14. In other embodiments, the substrate is a remaining portion of a bulk semiconductor substrate. Each fin structure that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor material portion 16 has a width from 4 nm to 30 nm. In another embodiment of the present application, each semiconductor material portion 16 has a width from 5 nm to 12 nm.

Although not shown, isolation regions including, for example, trench isolation structures and local isolation regions can be formed at this point of the present application utilizing processes that are well known to those skilled in the art.

Figure 2:
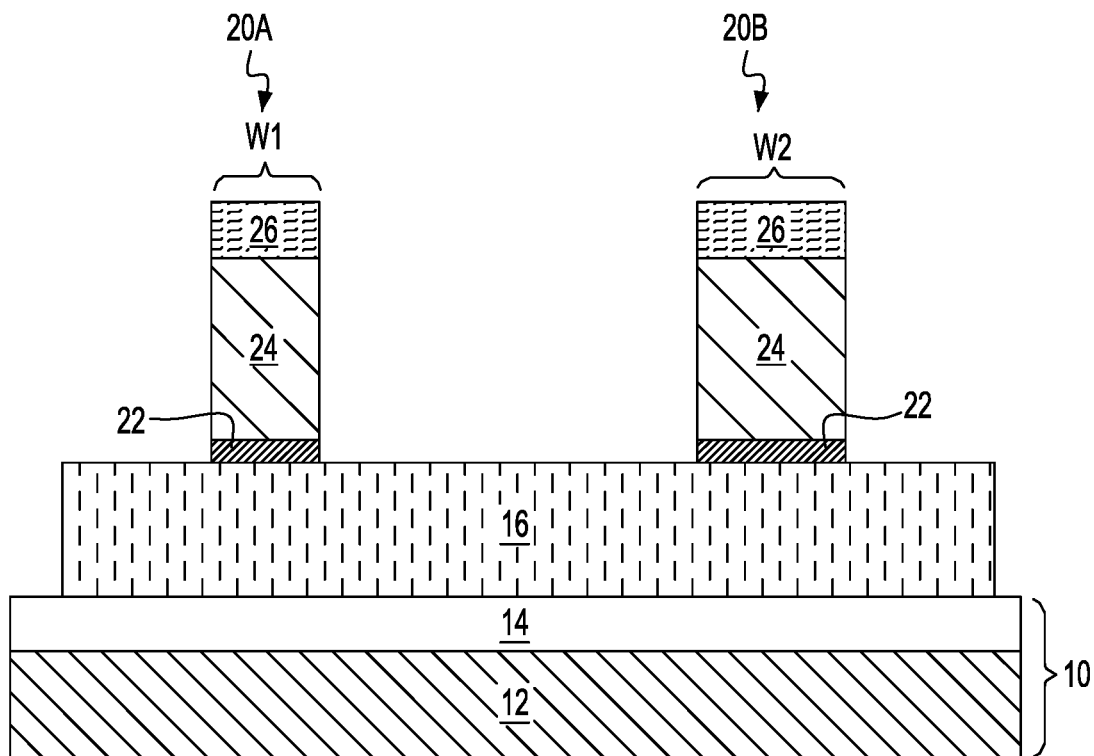
FIG. 2 is a cross-sectional view of the first exemplary semiconductor structure of FIG. 1 after forming a first sacrificial gate structure straddling a first portion of the semiconductor portion, and a second sacrificial gate structure straddling a second portion of the semiconductor portion.

Referring to FIG. 2, a first sacrificial gate structure 20A is formed straddling a first portion of the semiconductor portion 16, and a second sacrificial gate structure 20B is formed straddling a second portion of the semiconductor portion 16. By "straddling" it is meant that each sacrificial gate structure 20A, 20B is present on a topmost surface and sidewall surfaces of the semiconductor material portion 16. In embodiments in which the semiconductor material portion 16 is not a semiconductor fin, the sacrificial gate structures 20A, 20B would only be present on the topmost surface of the semiconductor material portion 16. The term "sacrificial gate structure" is used throughout the present application to denote a material stack that serves as a placeholder material for a functional gate structure to be subsequently formed. It should be noted that although multiple sacrificial gate structures 20A, 20B are described and illustrated, the present application can also be employed when a single sacrificial gate structure is formed.

In accordance with the present application, the first sacrificial gate structure 20A has a first width, w1, while the second sacrificial gate structure 20B has a second width, w2, that is greater than the first width, w1. It is noted that the first sacrificial gate structure 20A that has the first width, w1, can be used as a placeholder material for a short channel (p- or n-type) functional gate structure, while the second sacrificial gate structure 20B that has the second width, w2, can be used as a placeholder material for a long channel (p- or n-type) functional gate structure.

Each of the first and second sacrificial gate structures 20A, 20B can include, from bottom to top, a sacrificial gate dielectric 22, a sacrificial gate conductor 24 and a sacrificial gate cap 26. The first and second sacrificial gate structures 20A, 20B can be formed by first providing a sacrificial material stack (not shown) that includes, from bottom to top, a sacrificial gate dielectric layer, a sacrificial gate conductor layer and a sacrificial gate cap layer over the semiconductor material portion 16 and the insulator layer 14. In some embodiments of the present application, the sacrificial gate dielectric layer can be omitted. When present, the sacrificial gate dielectric layer includes a dielectric material such as an oxide or a nitride. In one embodiment, the sacrificial gate dielectric layer can include silicon oxide, silicon nitride, or silicon oxynitride. The sacrificial gate dielectric layer can be formed, for example, by CVD or PVD. The sacrificial gate dielectric layer can also be formed by conversion of a surface portion of the semiconductor material portion 16 by thermal oxidation or nitridation. The thickness of the sacrificial gate dielectric layer can be from 1 nm to 10 nm, although lesser and greater thicknesses can also be employed.

The sacrificial gate conductor layer may include a semiconductor material such as polysilicon or a silicon-containing semiconductor alloy such as a silicon-germanium alloy. The sacrificial gate conductor layer can be formed using CVD or PECVD. The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The sacrificial material stack can then be patterned by lithography and etching to form the sacrificial gate structures 20A, 20B. Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The patterned photoresist layer can be removed after the pattern transfer etch by a resist stripping process such as, for example, ashing. The remaining portions of the sacrificial dielectric layer constitute the sacrificial gate dielectrics 22, the remaining portions of the sacrificial gate conductor layer constitute the sacrificial gate conductors 24, and the remaining portions of the sacrificial gate cap layer constitute the sacrificial gate caps 26.

In some embodiments of the present application, the patterning of the sacrificial material stack may include a sidewall image transfer process similar to the one mentioned above in forming the semiconductor material portion 16.

Figure 3:
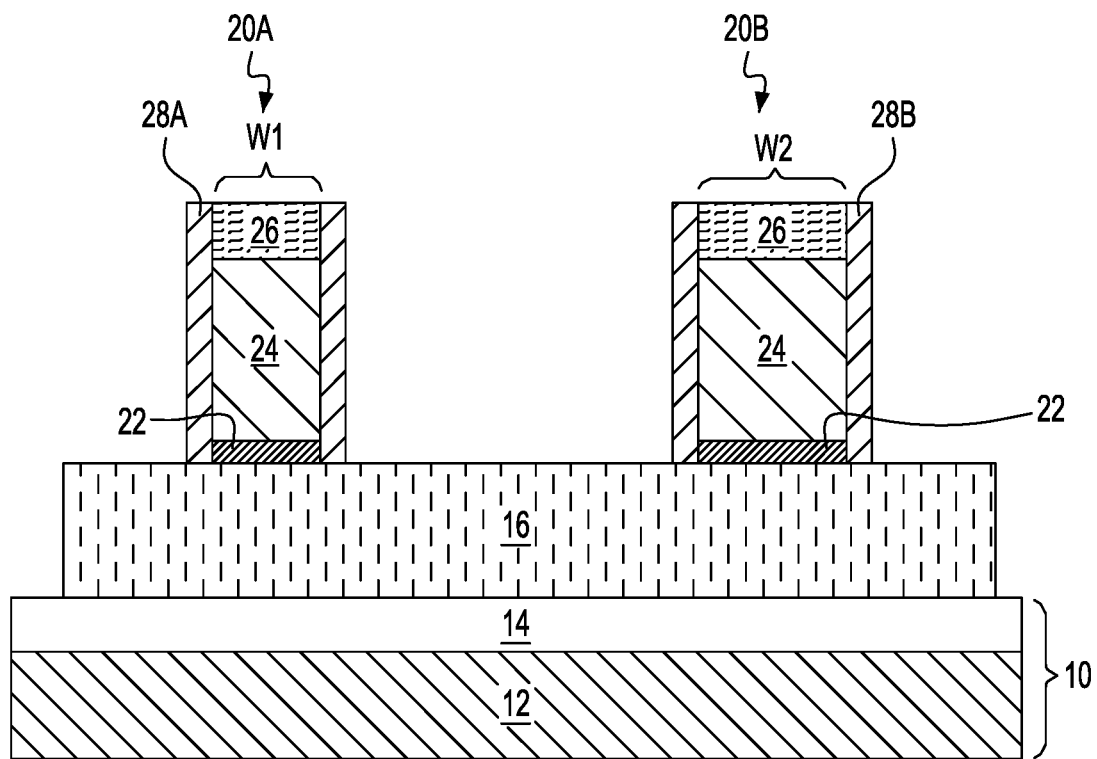
FIG. 3 is a cross-sectional view of the first exemplary semiconductor structure of FIG. 2 after forming a first gate spacer on sidewall surfaces of the first sacrificial gate structure, and a second gate spacer on sidewall surfaces of the second sacrificial gate structure.

Referring to FIG. 3, a first gate spacer 28A is formed on sidewall surfaces of the first sacrificial gate structure 20A and a second gate spacer 28B is formed on sidewall surfaces of the second sacrificial gate structure 20B. The first and second gate spacers 28A, 28B can include a dielectric material such as, for example, a dielectric oxide, a dielectric nitride, and/or a dielectric oxynitride. In one embodiment, each of the first and second gate spacers 28A, 28B is composed of silicon nitride. The first and second gate spacers 28A, 28B can be formed by first providing a conformal gate spacer material layer (not shown) on exposed surfaces of the sacrificial gate structures 20A, 20B, the semiconductor material portion 16 and the insulator layer 14 and then etching the gate spacer material layer to remove horizontal portions of the gate spacer material layer. The gate spacer material layer can be provided by a deposition process including, for example, CVD, PECVD or ALD. The etching of the gate spacer material layer may be performed by a dry etch process such as, for example, RIE. The remaining portions of the gate spacer material layer constitute the first and second gate spacers 28A, 28B, respectively. The width of each of the first and second gate spacers 28A, 28B, as measured at the base of the gate spacer 28 can be from 5 nm to 100 nm, although lesser and greater widths can also be employed.

Figure 4:
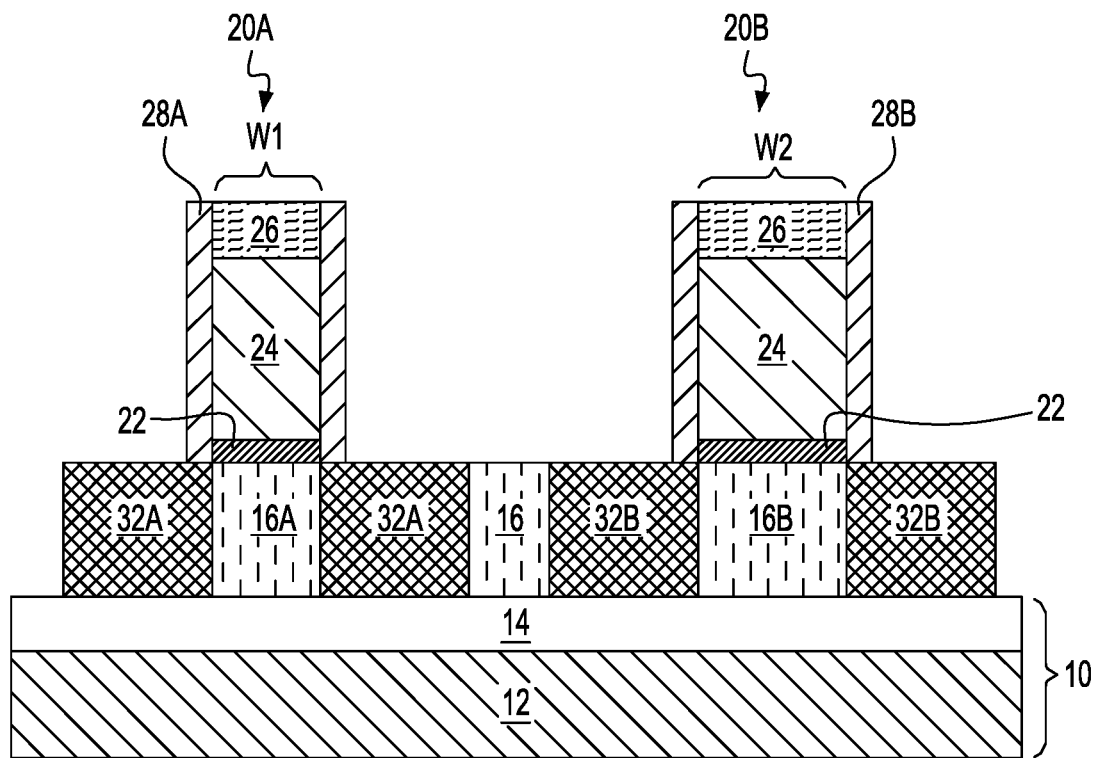
FIG. 4 is a cross-sectional view of the first exemplary semiconductor structure of FIG. 3 after forming first source/drain regions within portions of the semiconductor material portion on opposite sides of the first sacrificial gate structure, and second source/drain regions within portions of the semiconductor material portion on opposite sides of the second sacrificial gate structure.

Referring to FIG. 4, a first source region and a first drain region (collective referred to as first source/drain regions 32A) are formed within portions of the semiconductor material portion 16 on opposite sides of the first sacrificial gate structure 20A, and a second source region and a second drain region (collective referred to as second source/drain regions 32B) are formed within portions of the semiconductor material portion 16 on opposite sides of the second sacrificial gate structure 20B. The first and second source/drain regions 32A, 32B can be formed by doping the portions of the semiconductor material portion 16 on the opposite sides of the first sacrificial gate structure 20A and the second sacrificial gate structure 20B with n-type or p-type dopants, for example, by an ion implantation process. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous.

After source/drain formation, a portion of the semiconductor material portion 16 that is laterally surrounded by the first source/drain regions 32A constitutes a first channel region 16A of a first FET, while a portion of the semiconductor material portion 16 that is laterally surrounded by the second source/drain regions 32B constitutes a second channel region 16B of a second FET. An activation anneal can be subsequently performed to activate the implanted dopants in the first and second source/drain regions 32A, 32B.

Figure 5:
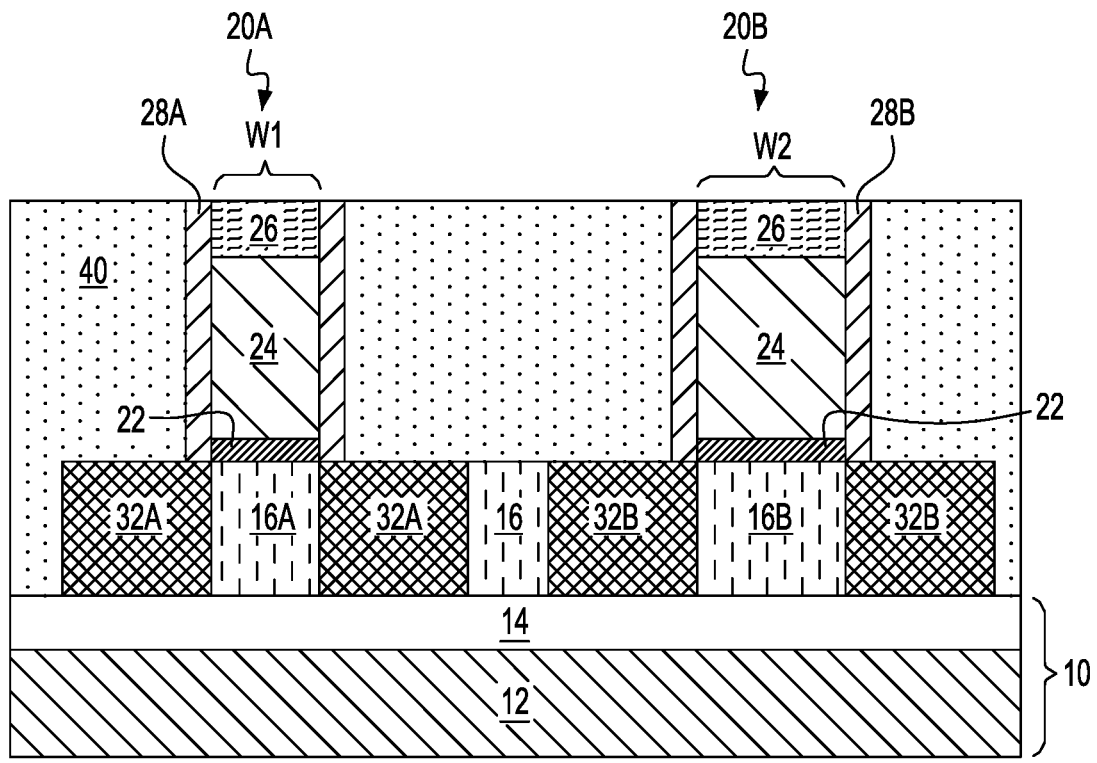
FIG. 5 is a cross-sectional view of the first exemplary semiconductor structure of FIG. 4 after forming an interlevel dielectric (ILD) layer.

Referring to FIG. 5, an interlevel dielectric (ILD) layer 40 is formed over the first and second source/drain regions 32A, 32B and the insulator layer 14 and laterally surrounds the first and second sacrificial gate structures 20A, 20B. In some embodiments of the present application, the ILD layer 40 is composed of a dielectric material that may be easily planarized. For example, the ILD layer 40 can include a doped silicate glass, an undoped silicate glass (silicon oxide), an organosilicate glass (OSG), a porous dielectric material, or amorphous carbon. The ILD layer 40 can be deposited using a conventional deposition process such as, for example, CVD, PECVD or spin coating. If the ILD layer 40 is not self-planarizing, following the deposition of the ILD layer 40, the ILD layer 40 can be subsequently planarized, for example, by chemical mechanical planarization (CMP) using topmost surfaces of the sacrificial gate structures 20A, 20B (i.e., the topmost surfaces of the sacrificial gate caps 26) as an etch stop. As shown, the topmost surface of the ILD layer 40 is coplanar with the topmost surfaces of the sacrificial gate caps 26.

Figure 6:
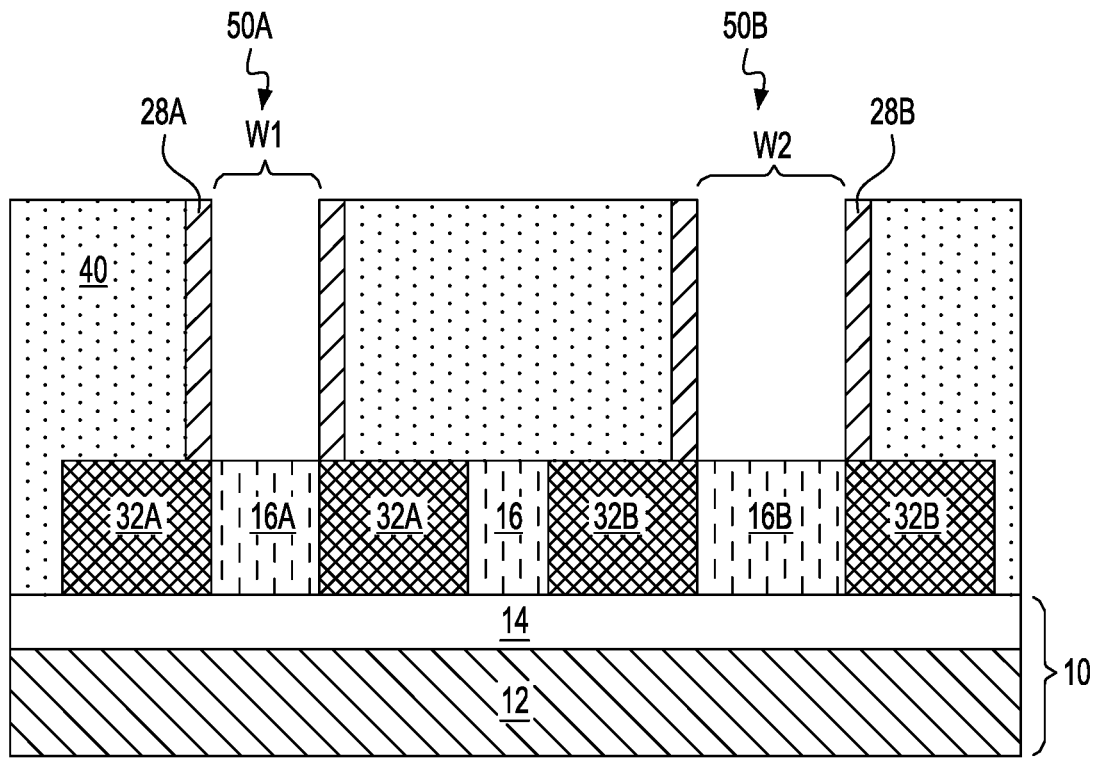
FIG. 6 is a cross-sectional view of the first exemplary semiconductor structure of FIG. 5 after forming a first gate cavity and a second gate cavity by removing the first sacrificial gate structure and the second sacrificial gate structure, respectively.

Referring to FIG. 6, the first and second sacrificial gate structures 20A, 20B are removed to provide a first gate cavity 50A and a second gate cavity 50B, respectively. The removal of the first and second sacrificial gate structures 20A, 20B can be achieved by etching. In one embodiment, a RIE process can be used to remove the first and second sacrificial gate structures 20A, 20B. The first gate cavity 50A occupies a volume from which the first sacrificial gate structure 20A is removed, and the second gate cavity 50B occupies a volume from which the second sacrificial gate structure 20B is removed. As such, the first gate cavity 50A has a width equal to w1, while the second gate cavity has a width equal to w2.

The removal of the first sacrificial gate structure 20A exposes the first channel region 16A and inner sidewall surfaces of the first gate spacer 28A formed on the vertical sidewalls of the first sacrificial gate structure 20A, while the removal of the second sacrificial gate structure 20A exposes the second channel region 16B and inner sidewall surfaces of the second gate spacer 28B formed on vertical sidewall surfaces of the second sacrificial gate structure 20B.

Figure 7:
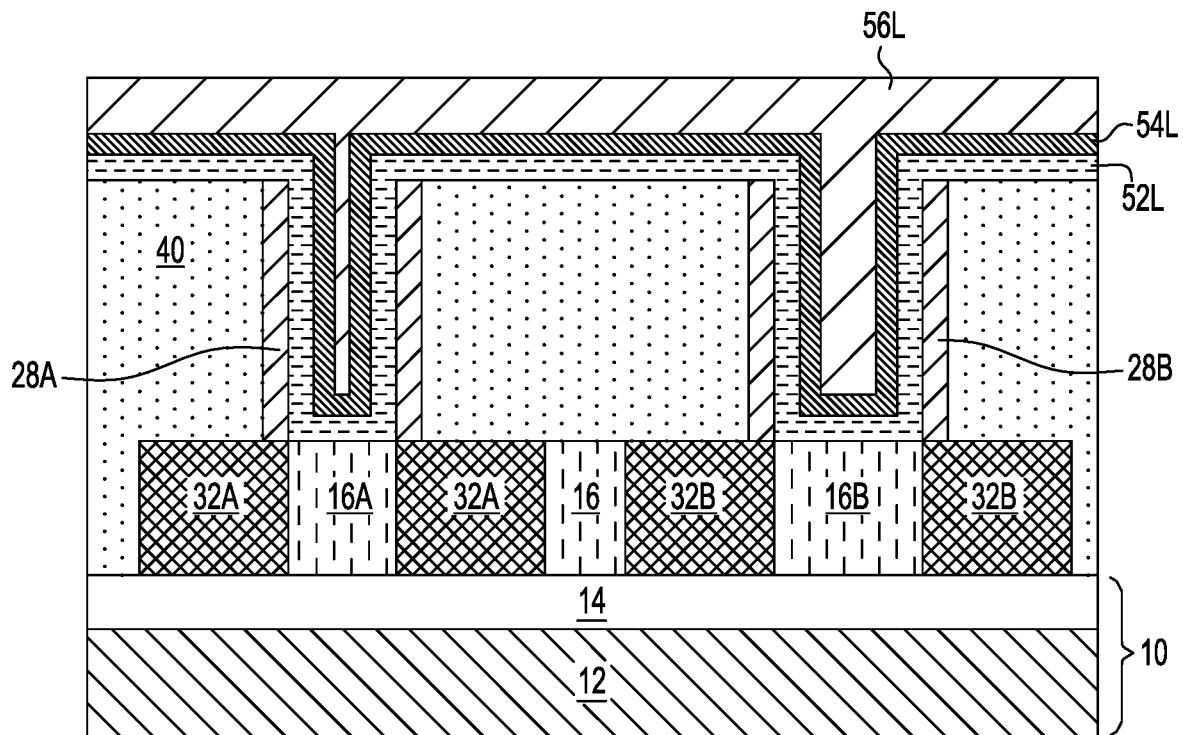
FIG. 7 is a cross-sectional view of the first exemplary semiconductor structure of FIG. 6 after forming a stack of a gate dielectric layer, a work function metal layer and a Co gate electrode layer filling the first and second gate cavities.

Referring to FIG. 7, a gate dielectric layer 52L is formed along sidewalls and bottom surfaces of the first and second gate cavities 50A, 50B and over the topmost surface of the ILD layer 40. The gate dielectric layer 52L can include a high dielectric constant (high-k) material having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. The gate dielectric layer 52L can be formed by a deposition process, such as, for example, CVD, physical vapor deposition (PVD) or ALD. The thickness of the gate dielectric layer 52L can be from 1 nm to 10 nm, although lesser or greater thicknesses can also be employed.

A work function metal layer 54L is subsequently deposited on the gate dielectric layer 52L. The work function metal layer 54L can include a metal nitride such as, for example, TiN. The work function metal layer 54L can be formed utilizing a deposition process such as, for example, CVD, PVD or ALD. The thickness of the work function metal layer 54L can be from 3 nm to 20 nm, although lesser and grater thicknesses can also be employed.

Next, a Co gate electrode layer 56L is deposited on the work function metal layer 54L to fill each of the first and second gate cavities 50A, 50B. The Co gate electrode layer 56L can be deposited, for example, by CVD, PECVD, PVD or ALD. The topmost surface of the Co gate electrode layer 56L is located above the topmost surface of the ILD layer 40.

Figure 8:
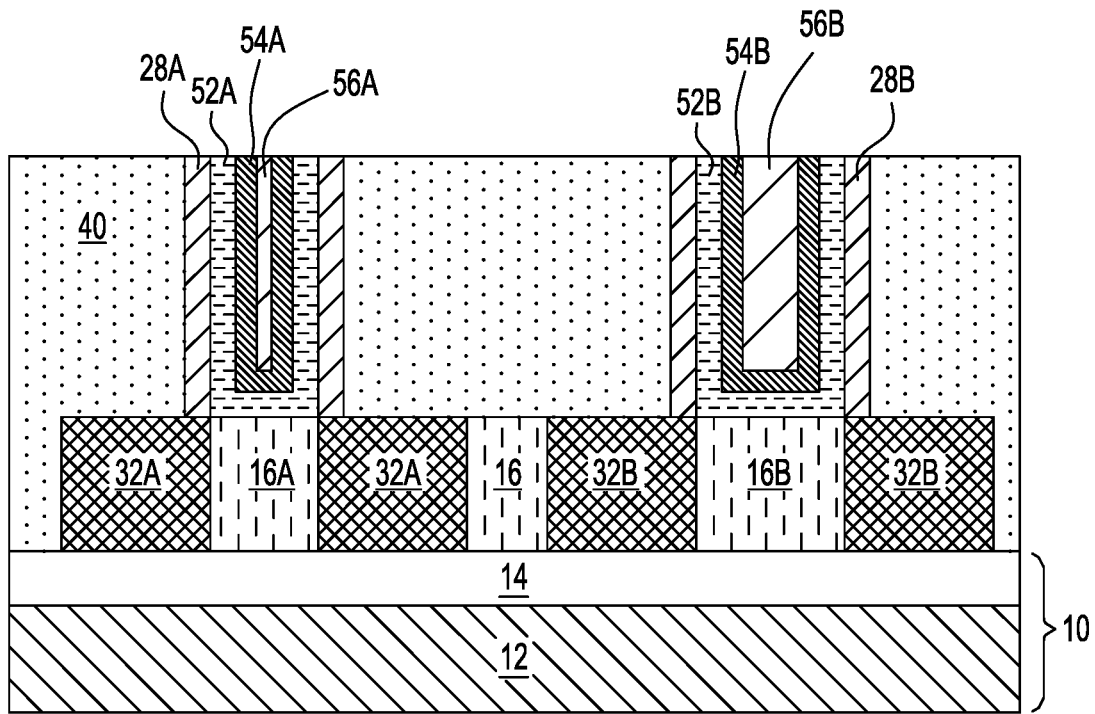
FIG. 8 is a cross-sectional view of the first exemplary semiconductor structure of FIG. 7 after forming a first stack of a first gate dielectric, a first work function metal and a first Co gate electrode in the first gate cavity, and a second stack of a second gate dielectric, a second work function metal and a second Co gate electrode in the first gate cavity.

Referring to FIG. 8, portions of the Co gate electrode layer 56L, the work function metal layer 54L and the gate dielectric layer 52L that are located above the topmost surface of the ILD layer 40 are removed by a planarization process such as, for example, CMP. A remaining portion of the gate dielectric layer 52L located in the first gate cavity 50A constitutes a first gate dielectric 52A, while a remaining portion of the gate dielectric layer 52L located in the second gate cavity 50B constitutes a second gate dielectric 52B. A remaining portion of the work function metal layer 54L located in the first gate cavity 50A constitutes a first work function metal 54A, while a remaining portion of the work function metal layer 54L located in the second gate cavity 50B constitutes a second work function metal 54B. A remaining portion of the Co gate electrode layer 56L located in the first gate cavity 50A constitutes a first Co gate electrode 56A, while a remaining portion of the Co gate electrode layer 56L located in the second gate cavity 50B constitutes a second Co gate electrode 56B. The first Co gate electrode 56A has a width less that the second Co gate electrode 56B due to the different widths of the first gate cavity 50A and the second gate cavity 50B.

After planarization and as shown in FIG. 8, the topmost surfaces of the first and second gate dielectrics 52A, 52B, the first and second work function metals 54A, 54B and the first and second Co gate electrodes 56A, 56B are coplanar with the topmost surface of the ILD layer 40.

Figure 9:
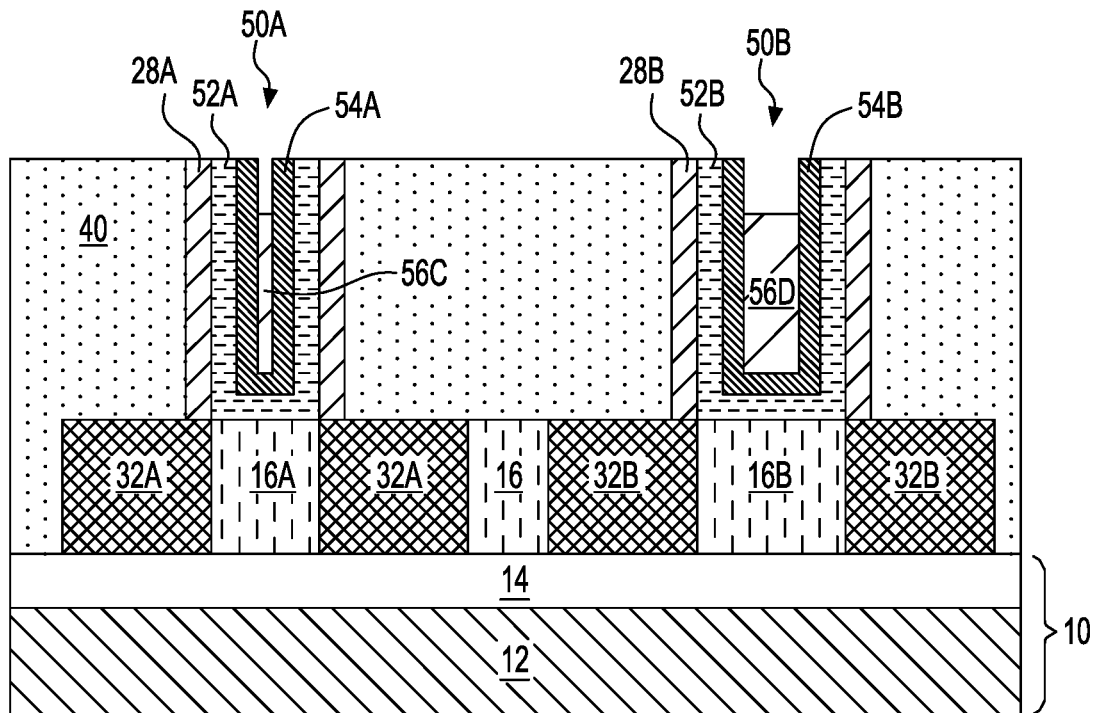
FIG. 9 is a cross-sectional view of the first exemplary semiconductor structure of FIG. 8 after forming a first Co gate electrode portion and a second Co gate electrode portion by recessing the first Co gate electrode and the second Co gate electrode, respectively.

Referring to FIG. 9, the first and second Co gate electrodes 56A, 56B are recessed below the topmost surface of the ILD layer 40, providing a first Co gate electrode portion 56C in the first gate cavity 50A and a second Co gate electrode portion 56D in the second gate cavity 52B. The recessing of the first and second Co gate electrodes 56A, 56B can be performed by oxidizing the first and second Co gate electrodes 56A, 50B to provide a cobalt oxide layer on a surface of each of the first and second Co gate electrodes 56A, 56B and removing the cobalt oxide layer from the surface of each of the first and second Co gate electrodes 56A, 56B by a chemical wet etch. The oxidation of the Co gate electrodes 56A, 56B can occur by subjecting the first and second Co gate electrodes 56A, 56B to an oxidizing agent such as, for example, ozonated deionized water ($DIO_3$), a hydrogen peroxide ($H_2O_2$) solution or an SC-1 solution containing a mixture of $H_2O_2$ and an ammonia-derived base. The ammonia-derived base includes ammonium hydroxide ($NH_4OH$) or quaternary $NH_4OH$. The wet etch chemistry employed selectively removes cobalt oxide with respect to metal that provides the first and second work function metals 54A, 54B and the dielectric material that provides the first and second dielectrics 52A, 52B, the first and second gate spacers 28A, 28B and the ILD layer 40. In one embodiment, the cobalt oxide layers can be removed with an acidic etching agent including one or more organic acids or inorganic acids. The etching can be carried out under ambient for a short period of time (around 1 min) or under a low oxygen environment where the oxygen concentration is less than 10,000 ppm for an extended period of time. In one embodiment, the cobalt oxide layer can be removed from the surface of each of the first and second Co gate electrodes 56A, 56B using 50:1 HCl. The oxidation and oxide removal steps can be repeated until the first and second Co gate electrodes 56A, 56B are recessed to any desired thickness. After the recessing process, a remaining portion of the first Co gate electrode 56A constitutes the first Co gate electrode portion 56C, and a remaining portion of the second Co gate electrode 56B constitutes the first Co gate electrode portion 56D.

The Co recessing process employed in the present application that involves repeated oxidation and oxide removal steps allows recessing Co uniformly across features with different pattern density and sizes. As such, the first Co gate electrode portion 56C has a thickness the same as the thickness of the second Co gate electrode portion 56D although the widths of the first and second Co gate electrode 56A, 56B are different.

Figure 10:
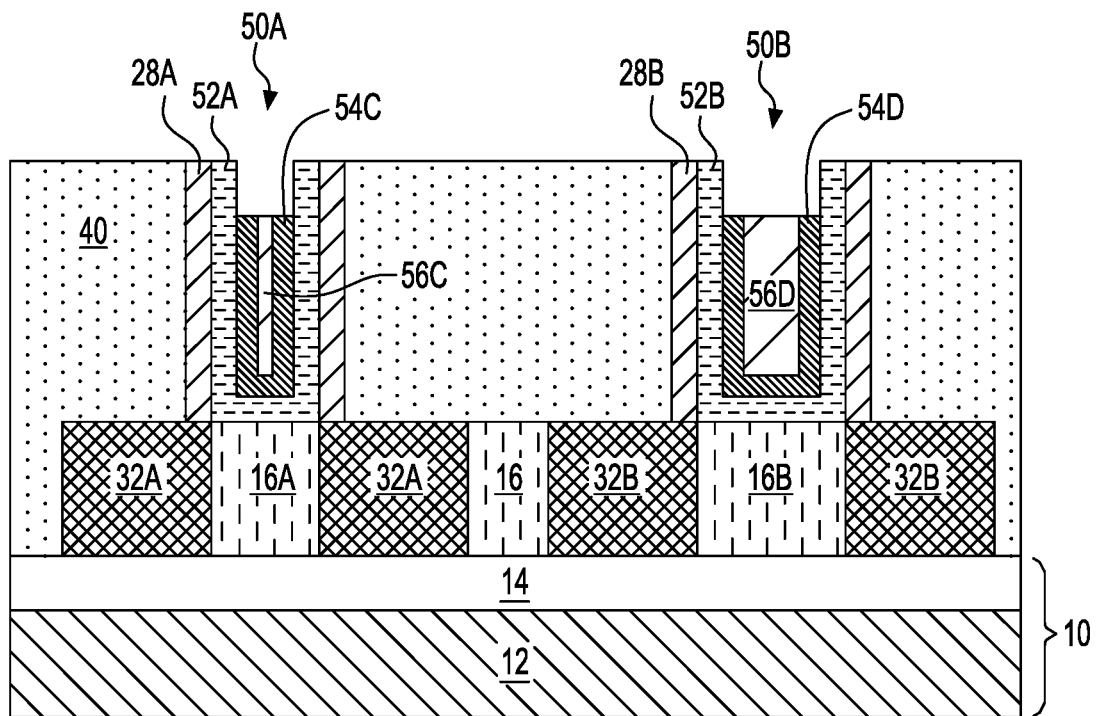
FIG. 10 is a cross-sectional view of the first exemplary semiconductor structure of FIG. 9 after forming a first work function metal portion and a second work function metal portion by recessing the first work function metal and the second work function metal, respectively.

Referring to FIG. 10, vertical portions of each of the first and second work function metals 54A, 54B are recessed below the topmost surface of the ILD layer 40 to provide a first work function metal portion 54C in the first gate cavity 50A and a second work function metal portion 54D in the second cavity 50B. In one embodiment, the first and second work function metals 54A, 54B can be recessed by an etch using a hot $H_2O_2$ solution or a hot SC-1 solution that is heated to a temperature above 70° C. For example, the recessing of the first and second work function metals 54A, 54B can be performed using a 30% $H_2O_2$ solution that is heated to 90° C. or an SC-1 solution that is heated to 75° C. In one embodiment, the recessing of the vertical portions of the first and second work function metals 54A, 54B can be performed after recessing of the first and second Co gate electrodes 56A, 56B is completed. In another embodiment, the recessing of the vertical portions of the first and second work function metals 54A, 54B can be performed before the last cobalt oxide layer is removed.

After the recessing process, a remaining portion of the first work function metal 54A constitutes the first work function metal portion 54C, while a remaining portion of the second work function metal 54B constitutes the second work function metal portion 54D. In one embodiment, the topmost surfaces of the first and second work function metal portions 54C, 54D are coplanar with the topmost surfaces of the first and second Co gate electrode portions 56C, 56D.

Figure 11:
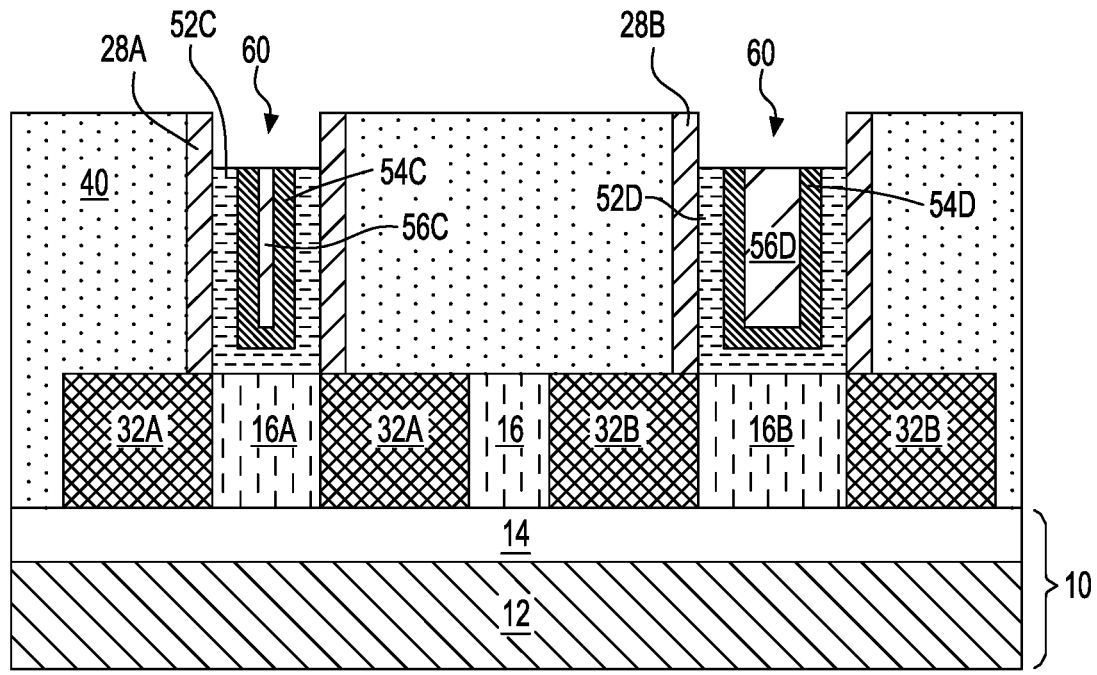
FIG. 11 is a cross-sectional view of the first exemplary semiconductor structure of FIG. 10 after forming a first gate dielectric portion and a second gate dielectric portion by recessing the first gate dielectric and the second gate dielectric, respectively.

Referring to FIG. 11, vertical portions of the first and second gate dielectrics 52A and 54A are recessed to provide a first gate dielectric portion 52C in the first gate cavity 50A and a second gate dielectric portion 52D in the second gate cavity 52B. The first and second gate dielectrics 52A, 52B can be recessed selective to the first and second gate spacers and the ILD layer 40 by any suitable etching technique known in the art. In one embodiment and when the gate dielectric layer 52L is composed of $HfO_2$, the first and the second gate dielectrics 52A, 52B may be recessed by a dry etch including $N_2$, $H_2$ and $CF_3$ or a chemical wet etch utilizing an HF etchant. After the recessing process, a remaining portion of the first gate dielectric 52A constitutes the first gate dielectric portion 52C, while a remaining portion of the second gate dielectric 52B constitutes the second gate dielectric portion 52D. The topmost surfaces of the first and second gate dielectric portions 52C, 52D are coplanar with the topmost surfaces of the first and second Co gate electrode portions 56C, 56D. A first opening 60A is thus provided over the topmost surfaces of the first gate dielectric portion 52C, a first work function metal portion 54C and a first Co gate electrode portion 56D, while a second opening 60B is thus provided over the topmost surfaces of the second gate dielectric portion 52D, a second work function metal portion 54D and a second Co gate electrode portion 56D.

Figure 12:
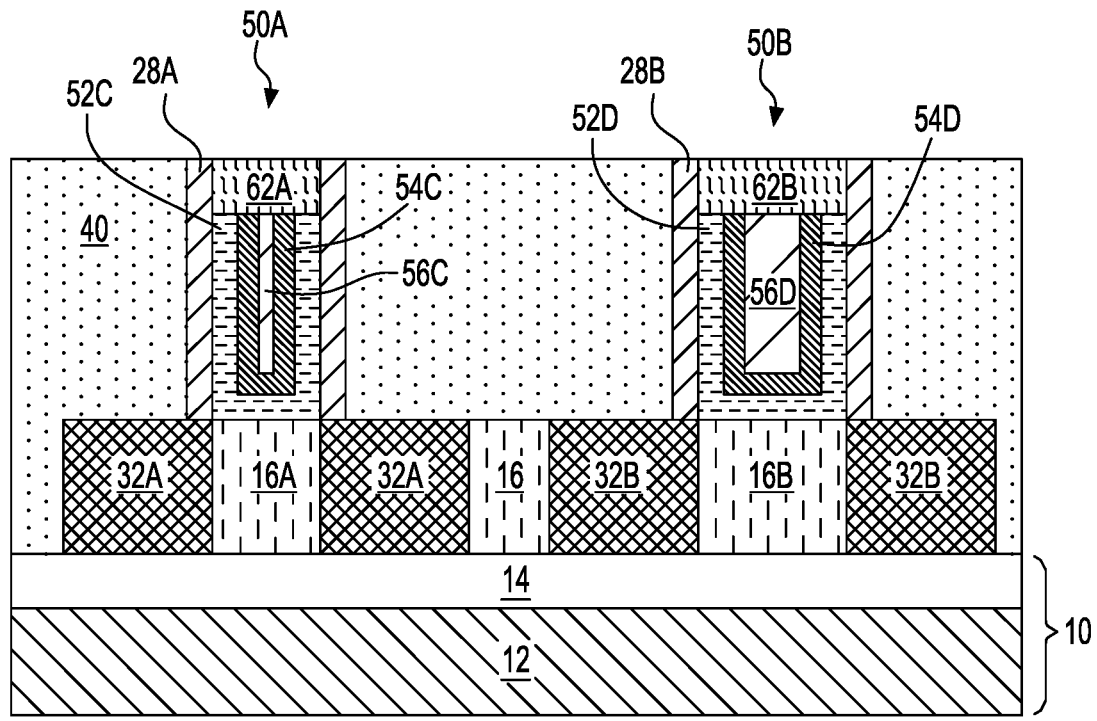
FIG. 12 is a cross-sectional view of the first exemplary semiconductor structure of FIG. 11 after forming a self-aligned first gate cap in an upper portion of the first gate cavity and a self-aligned second gate cap in an upper portion of the second gate cavity.

Referring to FIG. 12, a first gate cap 62A is formed within the first opening 60A, while a second gate cap 62B is formed within the second opening 60B. Each of the first and second gate caps 62A, 62B includes a dielectric material such as, for example, silicon dioxide, silicon nitride and/or silicon oxynitride. The first and second gate caps 62A, 62B can be formed by depositing a dielectric material into the first and second openings 60A, 60B by a deposition process including, but not limited to, CVD, PVD or PECVD. Following the deposition, the deposited dielectric material may be planarized stopping on the ILD layer 40. As such, each of the first and second gate caps 62A, 62B has a topmost surface coplanar with the topmost surface of the ILD layer 40. Also, a bottommost surface of the first gate cap 62A contacts the topmost surfaces of the first gate dielectric portion 52C, the first work function metal portion 54C and the first Co gate electrode portion 56C, while a bottommost surface of the second gate cap 62B contacts the topmost surfaces of the second gate dielectric portion 52D, the second work function metal portion 54D and the second Co gate electrode portion 56D.

As such, a first functional gate structure is formed in the first gate cavity 50A straddling a first channel region 16A of the semiconductor material portion 16. The first functional gate structure includes a first stack of, from bottom to top, a U-shaped first gate dielectric portion 52C, a U-shaped first work function metal portion 54C and a first Co gate electrode 56C, and a first gate cap 62A formed over the first stack (52C, 54C, 56C). A second functional gate structure is formed in the second gate cavity 50B straddling a second channel region 16B of the semiconductor material portion 16. The second functional gate structure includes a second stack of, from bottom to top, a U-shaped second gate dielectric portion 52D, a U-shaped second work function metal portion 54D and a second Co gate electrode portion 56D, and a second gate cap 62B formed over the second stack (52D,54D, 56D). The term "functional gate structure" means a structure used to control output current (i.e., flow of carriers in the channel) of a semiconducting device through electrical or magnetic fields.

In the present application, the oxidation and oxide removal processes described above for recessing Co in formation of gate gaps in functional gate structures can also be employed to form various Co-based contact and interconnect structures with contact caps which require Co recessing.

Figure 13:
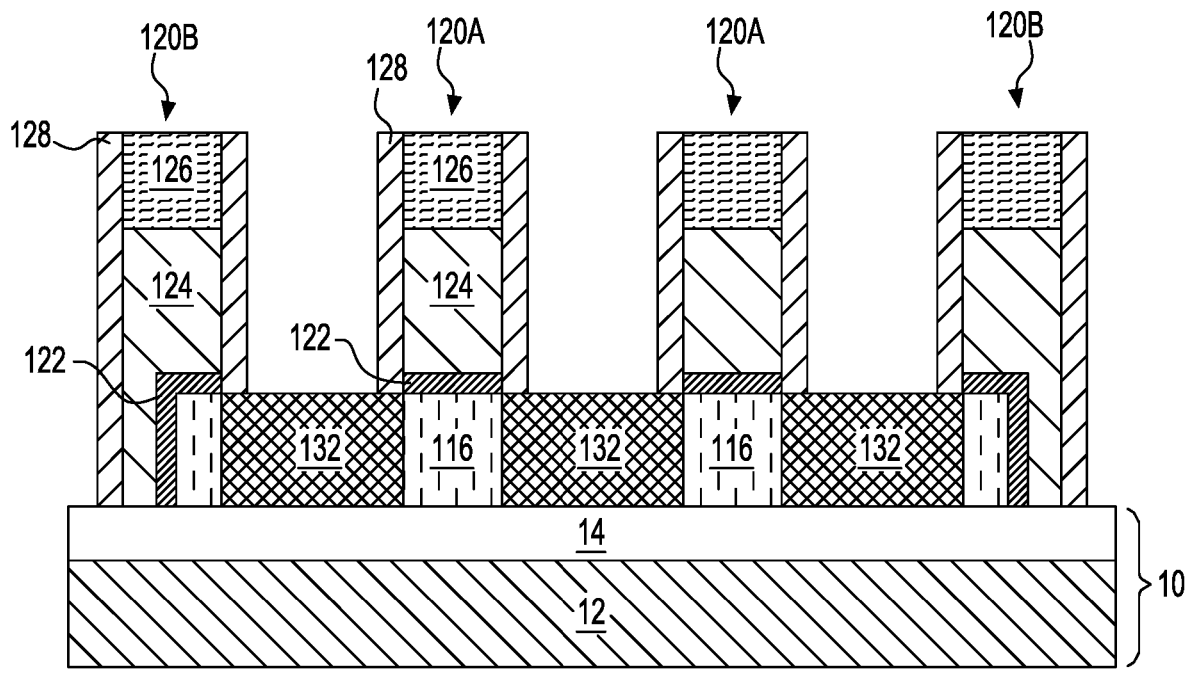
FIG. 13 is a cross-sectional view of a second exemplary semiconductor structure according to a second embodiment of the present application after forming active gate structures and dummy gate structures over the semiconductor material portion, forming a gate spacer on sidewalls of each of the gate structures and forming source/drain regions within the semiconductor material portion.

Referring to FIG. 13, a second exemplary semiconductor structure according to a second embodiment of the present application is derived from the first exemplary semiconductor structure of FIG. 1 by forming a plurality of gate structures on the semiconductor material portion 16. The gate structures include active gate structures 120A which are part of active devices such as FETs, and dummy gate structures 120B which are not part of active devices. As shown, the active gate structures 120A contact the semiconductor material portion 16 without contacting widthwise sidewalls of the semiconductor material portion 16, while the dummy gate structure 120B contact widthwise sidewalls of the semiconductor material portion 16. The gate structures 120A, 120B can be formed by performing the processing steps of FIG. 2.

Each of the active gate structures and dummy gate structures 120A, 120B includes, from bottom to top, a gate dielectric 122, a gate electrode 124 and a gate cap 126. The gate dielectric 122 can include an oxide, nitride or oxynitride. In one example, the gate dielectric 122 may include a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, multilayered gate dielectric 122 comprising different gate dielectric materials, e.g., silicon dioxide, and a high-k gate dielectric can be formed. The gate electrode 124 can include any conductive material including, for example, doped polysilicon, an elemental metal such as W, Co, Ti, Ta, Al, Ni, Ru, Pd and Pt, an alloy of at least two elemental metals, a metal nitride such as WN and TiN, a metal silicide such as WSi, NiSi, and TiSi or multilayered combinations thereof. The gate cap 126 can include a dielectric oxide, nitride or oxynitride. In one embodiment of the present application, the gate cap 126 includes silicon nitride.

In one embodiment, the gate structures 120A, 120B can be sacrificial gate structures that are subsequently removed, and replaced with functional gate structures each including a functional gate dielectric, a functional gate electrode and a functional gate cap after forming source and drain regions of the semiconductor structure.

Next, the processing steps of FIGS. 3 and 4 can be sequentially performed to form a spacer 128 on sidewalls of each of the gate structures 120A, 120B and form source/drain regions 132 within portions of the semiconductor material portion 16 that are not covered by the gate structures 120A, 120B. A portion of the semiconductor material portion 16 that underlies each of the active gate structure 120A constitutes a channel region 116.

Figure 14:
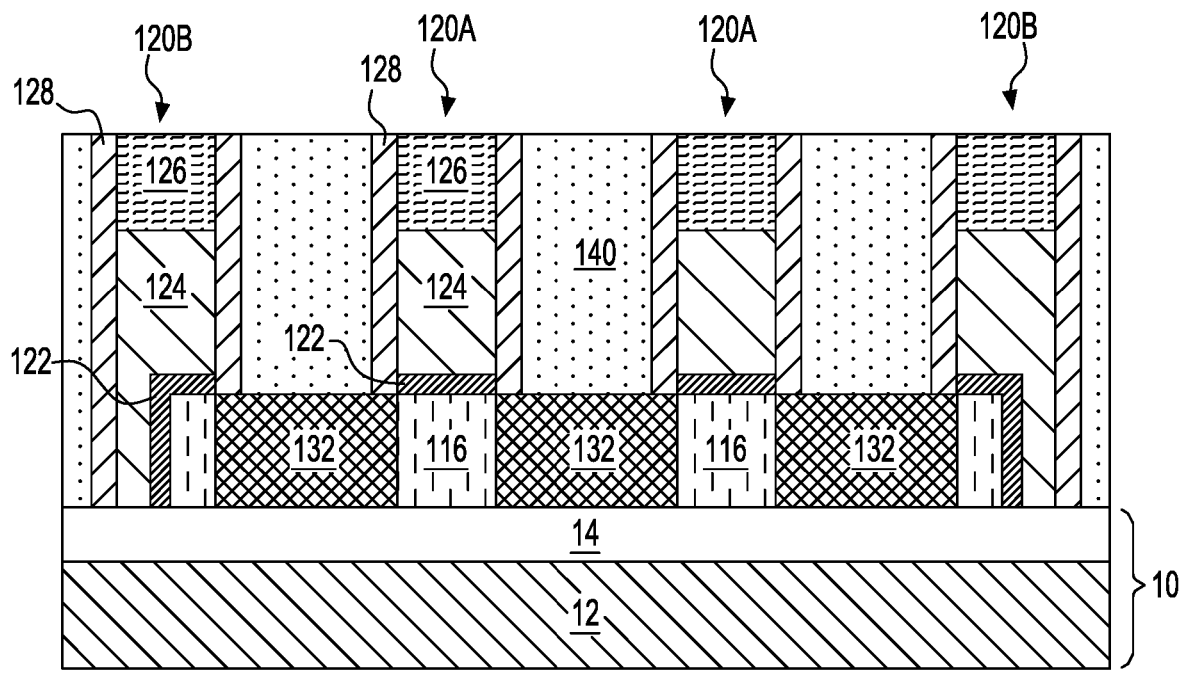
FIG. 14 is a cross-sectional view of the second exemplary semiconductor structure of FIG. 13 after forming an ILD layer over the source/drain regions and laterally surrounding the gate structures.

Referring to FIG. 14, the processing steps of FIG. 6 are performed to form an ILD layer 140 over the source/drain regions 132 and the substrate 10. In one embodiment and as shown, the ILD layer 140 has a topmost surface coplanar the topmost surfaces of the gate structures 120A, 120B (i.e., the topmost surfaces of the gate caps 126). In another embodiment, the ILD layer 140 has a topmost surface located above the topmost surfaces of the gate structures 120A, 120B (not shown).

Figure 15:
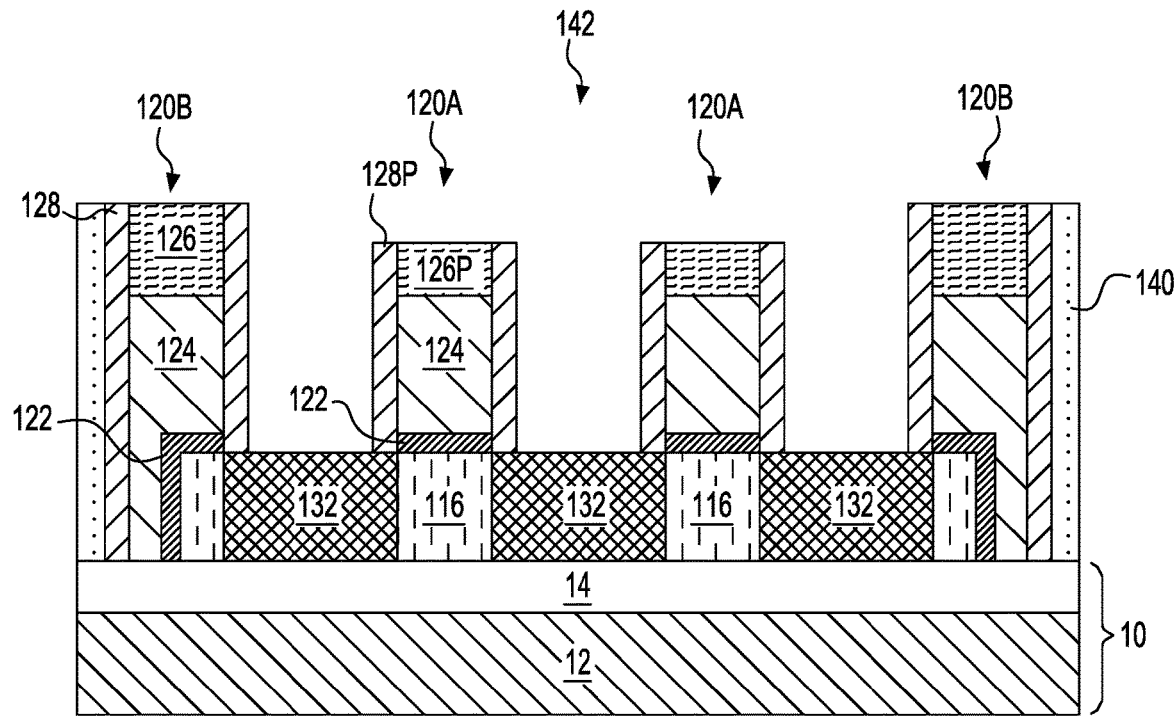
FIG. 15 is a cross-sectional view of the second exemplary semiconductor structure of FIG. 14 after forming a contact opening extending through the ILD layer, exposing the active gate structures and the source/drain regions.

Referring to FIG. 15, the ILD layer 140 is patterned to provide a contact opening 142. The contact opening 142 extends through the ILD layer 140, exposing the active gate structures 120A and the source/drain regions 132. The dummy gate structures 120B remains covered by the ILD layer 140. The formation of single contact opening 142 to expose all the active regions (i.e., the source/drain regions 132) can provide a wide process window for the lithography process. The contact opening 142 can be formed by applying a mask layer (not shown) over the ILD layer 140 and then lithographically patterning the mask layer to form an opening therein. The opening overlies the active gate structures 120A and the source/drain regions 132. The mask layer can be a photoresist layer or a photoresist layer in conjunction with a hardmask layer(s). The pattern in the mask layer is transferred through the ILD layer 140 to form the contact opening 142. In one embodiment of the present application, a RIE may be performed to remove the exposed portion of the ILD layer 140 to expose both the active gate structures 120A and the source/drain regions 132 within the contact opening 142. After forming the contact opening 142, the remaining mask layer can be removed by oxygen-based plasma etching.

Due to the finite selectivity of the etch chemistry that is employed in patterning the ILD layer 140, the gate spacers 128 and gate caps 126 of the active gate structures 120A that are not covered by the mask layer are also recessed during the patterning of the ILD layer 140. The active gate structures 120A thus have a reduced gate stack height as compared to the dummy gate structure 120B. A remaining portion of the gate cap 126 for each active gate structure 120A is herein referred to as a gate cap portion 126P, while a remaining portion of the gate spacer 128 for each active gate structure 120A is herein referred to as a gate spacer portion 128P. The topmost surfaces of the gate cap portions 126P and the gate spacer portions 128P are located below the topmost surface of the topmost surface of the ILD layer 140.

Figure 16:
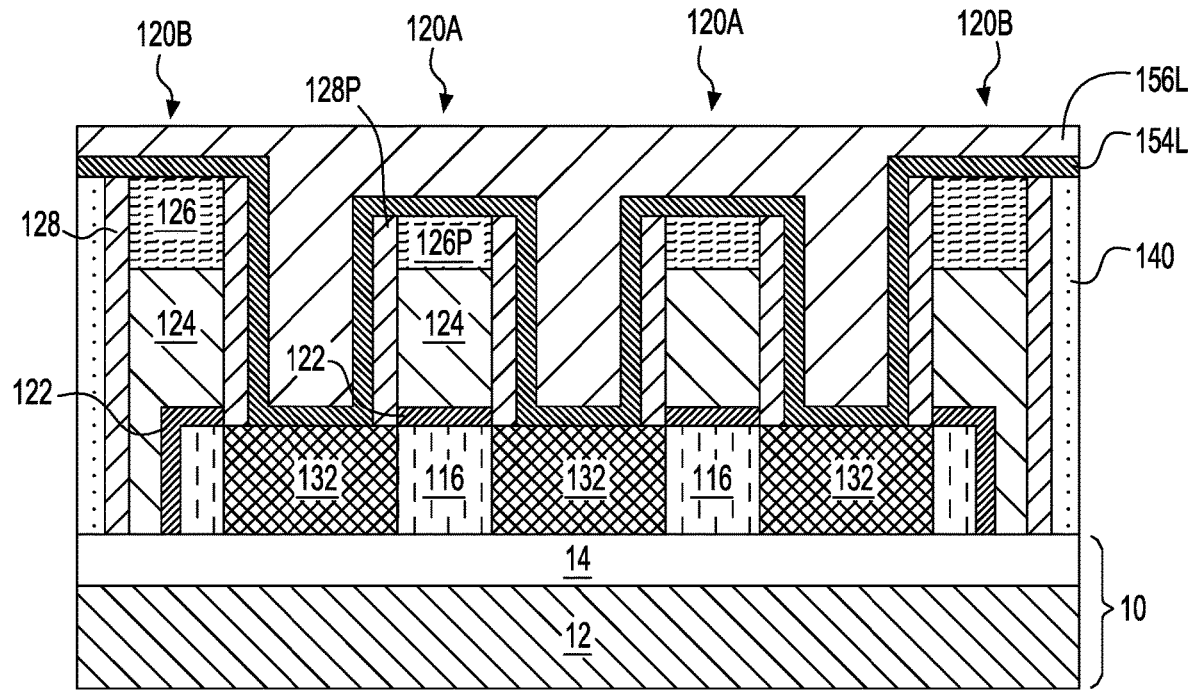
FIG. 16 is a cross-sectional view of the second exemplary semiconductor structure of FIG. 15 after forming a contact liner layer along exposed surfaces of the source/drain regions, the active gate structures, the dummy gate structures and the ILD layer and forming a Co contact conductor layer on the contact liner layer to completely fill the contact opening.

Referring to FIG. 16, a conformal contact liner layer 154L is deposited along exposed surfaces including the surfaces of source/drain regions 132, the active gate structures 120A, the dummy gate structures 120B and the ILD layer 140. In one embodiment, the contact liner layer 154L may include TiN or a stack of Ti/TiN. Subsequently, a Co contact conductor layer 156L is deposited on the contact liner layer 154L to completely fill the contact opening 142. The contact liner layer 154L and the Co contact conductor layer 156L can be formed by performing the processing steps of FIG. 7. The thickness of the contact liner layer 154L can be from 1 nm to 5 nm, although lesser and greater thicknesses can also be employed. The Co contact conductor layer 156L is deposited to a thickness such that the topmost surface of the Co contact conductor layer 156L is located above the topmost surface of the ILD layer 140.

Figure 17:
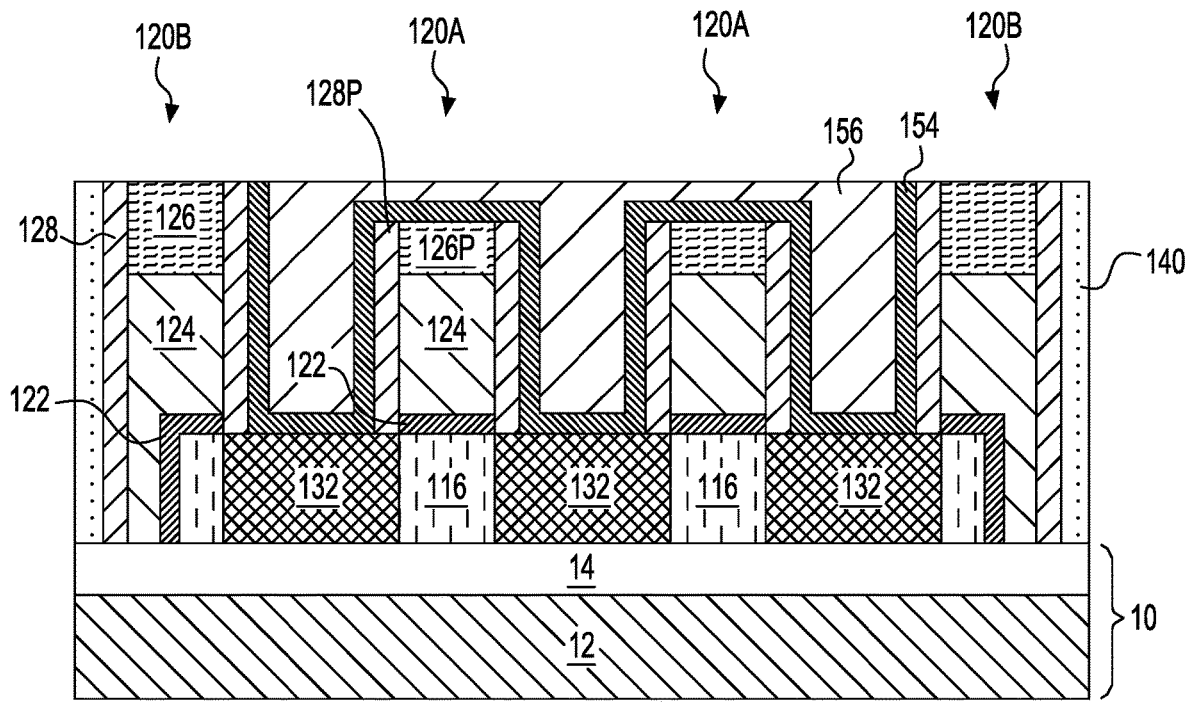
FIG. 17 is a cross-sectional view of the second exemplary semiconductor structure of FIG. 16 after forming a contact liner and a Co contact conductor within the contact opening.

Referring to FIG. 17, portions of the contact liner layer 154L and the Co contact conductor layer 156L that are located above the topmost surface of the ILD layer 140 are removed by employing a planarization process, such as, for example, CMP. A remaining portion of the contact liner layer 154L located within the contact opening 142 is herein referred to as a contact liner 154, while a remaining portion of the Co contact conductor layer 156L located within the contact opening 142 is herein referred to as a Co contact conductor 156. The topmost surfaces of the contact liner 154 and the Co contact conductor 156 are coplanar with the topmost surface of the ILD layer 140.

Figure 18:
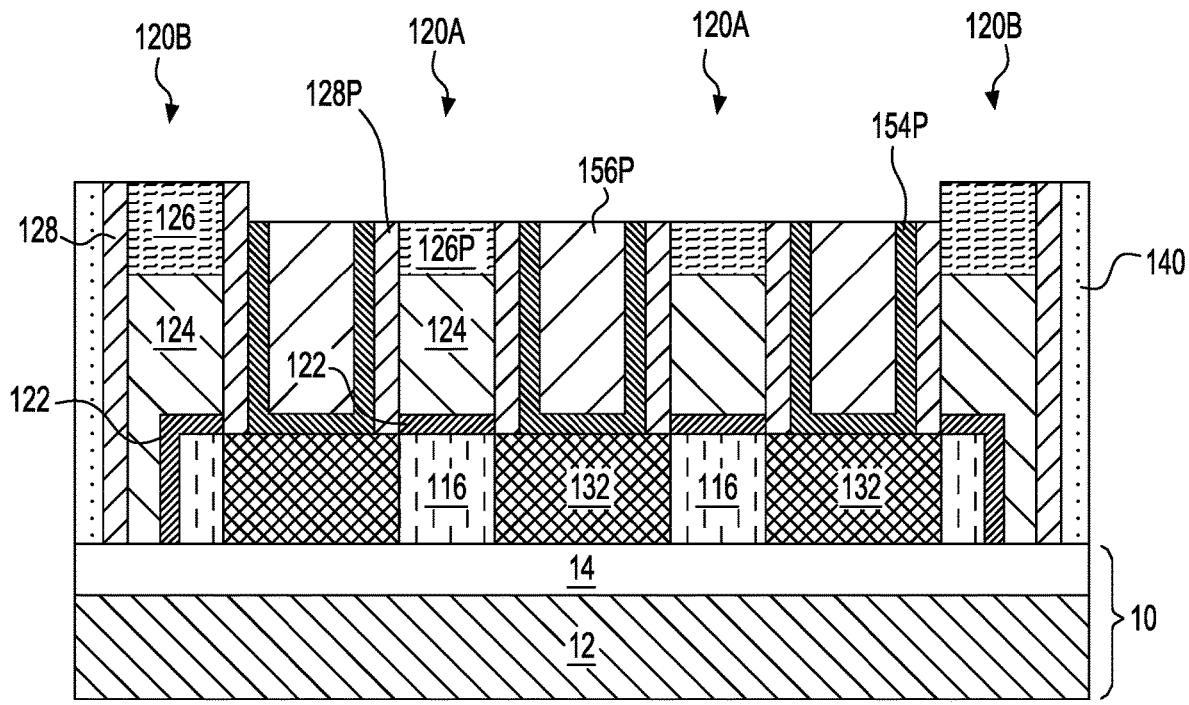
FIG. 18 is a cross-sectional view of the second exemplary semiconductor structure of FIG. 17 after recessing the contact liner and the Co contact conductor.

Referring to FIG. 18, the processing steps of FIGS. 9 and 10 can be performed to recess the contact liner 154 and the Co contact conductor 156. A remaining portion of the contact liner 154 located on sidewalls and a bottom of one of the spaces between the gate structures 120A, 120B is herein referred to a contact liner portion 154P, while a remaining portion of the Co contact conductor 154 located within one of the spaces between the gate structures 120A, 120B is herein referred to a Co contact conductor portion 156P. The topmost surfaces of the contact liner portion 154P and the Co contact conductor portion 156P are located below the topmost surface of the ILD layer 140 and are coplanar with the topmost surfaces of the gate cap portions 126P of the active gate structures 120A. A self-aligned contact including a contact liner portion 154P and a Co contact conductor portion 156P is thus formed within one of the spaces between gate structures 120A, 120B to form contact with one of the source/drain regions 132.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    providing a structure comprising a gate cavity exposing a portion of a semiconductor material portion, wherein a gate spacer surrounds the gate cavity;
    forming a material stack comprising, from bottom to top, a gate dielectric, a work function metal and a cobalt gate electrode within the gate cavity;
    recessing the cobalt gate electrode, wherein the recessing the cobalt gate electrode is performed by repeating steps of oxidizing the cobalt gate electrode utilizing an oxidizing agent to form a cobalt oxide layer on a surface of a remaining portion of the cobalt gate electrode and removing the cobalt oxide layer utilizing a chemical wet etch that includes use of an acidic etching agent comprising one or more organic acids or inorganic acids;
    recessing the work function metal;
    recessing the gate dielectric; and
    forming a gate cap above the recessed cobalt gate electrode to completely fill the gate cavity.

2. The method of claim 1, wherein the gate cap has a bottommost surface contacting topmost surfaces of the recessed gate dielectric, the recessed work function metal and the recessed cobalt gate electrode.

3. The method of claim 1, wherein the providing of the structure comprises:
    forming a sacrificial gate structure on the portion of the semiconductor material portion;
    forming the gate spacer on sidewalls of the sacrificial gate structure;
    forming a source region and a drain region on opposites of the sacrificial gate structure;
    forming an interlevel dielectric (ILD) layer on outer sidewalls of the gate spacer and surrounding the sacrificial gate structure; and
    removing the sacrificial gate structure by etching.

4. The method of claim 1, wherein the oxidizing agent comprises ozonated deionized water ($DIO_3$), a hydrogen peroxide ($H_2O_2$) solution, or an SC-1 solution containing a mixture of $H_2O_2$ and an ammonia-derived base, wherein the ammonia-derived base comprises $NH_4OH$ or quaternary $NH_4OH$.

5. The method of claim 1, wherein the chemical wet etch is performed for a period of time of about 1 minute.

6. The method of claim 1, wherein the chemical wet etch is performed under an oxygen environment having an oxygen concentration of less than 10,000 ppm.

7. The method of claim 1, wherein the chemical wet etch comprises HCl.

8. The method of claim 1, wherein the recessing of the work function metal is performed after the recessing the cobalt gate electrode.

9. The method of claim 1, wherein the semiconductor material portion is a semiconductor fin, and the semiconductor fin is located on an insulator layer.

10. The method of claim 1, wherein the cobalt gate electrode is composed entirely of cobalt.

11. The method of claim 1, wherein an interlevel dielectric (ILD) layer is located laterally adjacent to the gate spacer, and the ILD layer has a topmost surface that is coplanar to a topmost surface of the gate spacer.

12. The method of claim 1, wherein the work function metal comprises TiN.

13. The method of claim 12, wherein the recessing of the work function metal is carried out using a $H_2O_2$ solution that is heated to a temperature above 70° C.

14. The method of claim 12, wherein the recessing of the work function metal is carried out in an SC-1 solution containing a mixture of $H_2O_2$ and an ammonia-derived base, wherein the ammonia-derived base comprises $NH_4OH$ or quaternary $NH_4OH$, and the SC-1 solution is heated to a temperature above 70° C.

15. A method of forming a semiconductor structure comprising:

providing a structure comprising a gate cavity exposing a portion of a semiconductor material portion, wherein a gate spacer surrounds the gate cavity;

forming a material stack comprising, from bottom to top, a gate dielectric, a work function metal and a cobalt gate electrode within the gate cavity;

recessing the cobalt gate electrode, wherein the recessing the cobalt gate electrode is performed by repeating steps of oxidizing the cobalt gate electrode utilizing an oxidizing agent to form a cobalt oxide layer on a surface of a remaining portion of the cobalt gate electrode and removing the cobalt oxide layer utilizing a chemical wet etch that is performed under an oxygen environment having an oxygen concentration of less than 10,000 ppm;

recessing the work function metal;

recessing the gate dielectric; and forming a gate cap above the recessed cobalt gate electrode to completely fill the gate cavity.

16. A method of forming a semiconductor structure comprising:

providing a structure comprising a gate cavity exposing a portion of a semiconductor material portion, wherein a gate spacer surrounds the gate cavity;

forming a material stack comprising, from bottom to top, a gate dielectric, a work function metal and a cobalt gate electrode within the gate cavity, wherein the work function metal comprises TiN;

recessing the cobalt gate electrode, wherein the recessing the cobalt gate electrode is performed by repeating steps of oxidizing the cobalt gate electrode utilizing an oxidizing agent to form a cobalt oxide layer on a surface of a remaining portion of the cobalt gate electrode and removing the cobalt oxide layer utilizing a chemical wet etch;

recessing the work function metal, wherein the recessing of the work function metal comprises using a $H_2O_2$ solution that is heated to a temperature above 70° C. or an SC-1 solution containing a mixture of $H_2O_2$ and an ammonia-derived base, wherein the ammonia-derived base comprises $NH_4OH$ or quaternary $NH_4OH$, and the SC-1 solution is heated to a temperature above 70° C.;

recessing the gate dielectric; and forming a gate cap above the recessed cobalt gate electrode to completely fill the gate cavity.

* * * * *